United States Patent
Umeno et al.

(10) Patent No.: US 7,563,319 B2
(45) Date of Patent: Jul. 21, 2009

(54) MANUFACTURING METHOD OF SILICON WAFER

(75) Inventors: Shigeru Umeno, Tokyo (JP); Masataka Hourai, Tokyo (JP); Masakazu Sano, Tokyo (JP); Shinichiro Miki, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 45 days.

(21) Appl. No.: 10/524,778

(22) PCT Filed: Dec. 19, 2003

(86) PCT No.: PCT/JP03/16441

§ 371 (c)(1),
(2), (4) Date: Feb. 16, 2005

(87) PCT Pub. No.: WO2004/073057

PCT Pub. Date: Aug. 26, 2004

(65) Prior Publication Data

US 2005/0229842 A1    Oct. 20, 2005

(30) Foreign Application Priority Data

Feb. 14, 2003   (JP) ............................... 2003-037523

(51) Int. Cl.
*H01L 21/324*   (2006.01)
(52) U.S. Cl. ............... 117/20; 117/3; 117/13; 117/916; 423/324; 423/348; 428/446; 438/311
(58) Field of Classification Search ............... 117/14, 117/19, 13, 95, 2, 3, 20, 916, 944; 257/610; 438/455, 795, 471, 93, 95, 311, 423, 479; 428/64.1, 304.4, 307.3, 312.2, 312.6, 315.5, 428/315.7, 428, 446, 448; 423/324, 328.2, 423/348
See application file for complete search history.

(56) References Cited

U.S. PATENT DOCUMENTS 4,119,441 A * 10/1978 Haas et al. .................. 438/512

(Continued)

FOREIGN PATENT DOCUMENTS

EP    0 969 505 A2    1/2000

(Continued)

OTHER PUBLICATIONS

Umeno, Shigeru et al., "Dependence of Grown-in Defect Behavior on Oxygen Concentration in Czoxhralski Silicon Crystals", *Jpn. J. Appl. Phys.*, vol. 38 (1999), pp. 5725-5730.

(Continued)

*Primary Examiner*—Eric Hug
*Assistant Examiner*—Seyed Masoud Malekzadeh
(74) *Attorney, Agent, or Firm*—Kubovcik & Kubovcik

(57) ABSTRACT

An active layer side silicon wafer is heat-treated in an oxidizing atmosphere to thereby form a buried oxide film therein. The active layer side silicon wafer is then bonded to a supporting side wafer with said buried oxide film interposed therebetween thus to fabricate an SOI wafer. Said oxidizing heat treatment is carried out under a condition satisfying the following formula:

$$[Oi] \leq 2.123 \times 10^{21} \exp(-1.035/k(T+273)),$$

where, T is a temperature of the heat treatment, and [Oi] (atmos/cm$^3$) is an interstitial oxygen concentration.

12 Claims, 1 Drawing Sheet

U.S. PATENT DOCUMENTS

| | | | |
|---|---|---|---|
| 4,806,497 A | 2/1989 | Adam et al. | 437/6 |
| 6,139,625 A * | 10/2000 | Tamatsuka et al. | 117/19 |
| 6,228,164 B1 * | 5/2001 | Ammon et al. | 117/19 |
| 6,245,311 B1 * | 6/2001 | Kobayashi et al. | 423/348 |
| 6,336,968 B1 * | 1/2002 | Falster | 117/2 |
| 6,503,594 B2 * | 1/2003 | Park | 428/64.1 |
| 6,641,888 B2 * | 11/2003 | Asayama et al. | 428/64.1 |
| 6,642,123 B2 * | 11/2003 | Mun et al. | 438/402 |
| 6,680,260 B2 * | 1/2004 | Akiyama et al. | 438/766 |
| 6,803,331 B2 * | 10/2004 | Holzl et al. | 438/795 |
| 2002/0024152 A1 | 2/2002 | Momoi et al. | 257/913 |
| 2002/0142562 A1 | 10/2002 | Chan et al. | 438/406 |
| 2003/0056715 A1 * | 3/2003 | Tachikawa et al. | 117/30 |
| 2003/0106484 A1 * | 6/2003 | Fusegawa et al. | 117/19 |
| 2003/0106485 A1 * | 6/2003 | Kononchuk et al. | 117/30 |
| 2003/0134492 A1 * | 7/2003 | Lerch et al. | 438/503 |
| 2004/0187769 A1 * | 9/2004 | Aoki | 117/95 |
| 2004/0207048 A1 * | 10/2004 | Shiota et al. | 257/610 |
| 2005/0064632 A1 * | 3/2005 | Sakurada et al. | 438/149 |
| 2006/0024915 A1 * | 2/2006 | Kobayashi | 438/455 |
| 2006/0130737 A1 * | 6/2006 | Wakabayashi et al. | 117/13 |

FOREIGN PATENT DOCUMENTS

| | | |
|---|---|---|
| JP | 6-21033 A | 1/1994 |
| JP | 7-66149 | 3/1995 |
| JP | 8-330316 A | 12/1996 |
| JP | 9-22993 A | 1/1997 |
| JP | 2000-49063 A | 2/2000 |
| JP | 3085184 B2 | 7/2000 |
| JP | 2001-274166 A | 10/2001 |
| JP | 2002-009020 A | 1/2002 |
| JP | 2003-297840 A | 10/2003 |
| WO | 93/10557 A1 | 5/1993 |

OTHER PUBLICATIONS

Japan Institute of Invention and Innovation Journal of Technical Disclosure No. 98-477, Feb. 2, 1998.

Ren, Bingyan et al., "Study on the Donor and the Defect Energy Level in High Dose Neutron Transmutation Doping CZ Silicon", *Journal of Heibei Institute of Technology*, No. 1, 1988, pp. 45-52.

Shi, Zhiyi et al., "Mechanical Strength Distribution of NCZ-Si Rod Under a Nitrogen Atmosphere", *Rare Metals*, vol. 17, No. 1, 1993, pp. 17-20.

* cited by examiner

MANUFACTURING METHOD OF SILICON WAFER

This application is a 371 of international application PCT/JP2003/016441, which claims priority based on Japanese patent application No. 2003-37523 filed Feb. 14, 2003, which is incorporated herein by reference.

FIELD OF THE INVENTION

The present invention relates to a manufacturing method of a silicon wafer, specifically to a manufacturing method of a silicon wafer with reduced COP and also to a manufacturing method of a SOI wafer using the same silicon wafer.

PRIOR ART

In general, a single crystal of silicon, which has grown with the Czochralski method (i.e., the CZ method), contains defects, each having a size of about 0.1 µm to 0.3 µm, in a density of $1 \times 10^5/cm^3$ to $1 \times 10^7/cm^3$ even in the condition just after its having been grown (in the as-grown state). Such a defect is identified as a minute void generated by an aggregation of excess vacancy during cooling of the silicon single crystal. As it is, when a silicon wafer that has been sliced from that silicon single crystal is polished, those minute voids would come exposed as turning out to be pits in a surface of the silicon wafer. Those pits and other voids existing in the vicinity of the surface could be obstacles in a fine device structure. Those defects are referred to as COP (Crystal Originated Particle).

There are known methods for reducing the COP in the silicon wafer, including, for example, a method disclosed in the Japanese Patent Laid-open Publication No. Hei9-22993, in which a heat treatment is applied to a silicon wafer in a reducing atmosphere by hydrogen and the like or in an inert atmosphere by argon and the like.

Another method has been known, as disclosed in the Japanese Patent Publication No. 3085184, in which an epitaxial wafer is used for a silicon wafer in an active layer side (hereafter, referred to as an active layer side silicon wafer) of a SOI wafer.

In yet another known method, as disclosed in the Japanese Patent Laid-open publication No. Hei8-330316, during growing of a silicon single crystal, a ratio of its growing rate V to a temperature gradient G in the single crystal defined along a growing direction of the silicon single crystal, or V/G, is controlled appropriately to thereby allow the growing of the silicon single crystal containing no COP.

The method for applying the heat treatment in the hydrogen or argon atmosphere has been found effective to vanish the COP existing in a region defined by a depth less than some µm from the surface of the silicon wafer. This method, however, has not worked effectively to vanish the COP existing in a region defined by the depth more than some µm from the surface of the silicon wafer.

In the method using the epitaxial wafer for the active layer side silicon wafer, it is true that the SOI wafer having an active layer containing no COP can be manufactured because of no COP existing in the epitaxial wafer, but it is impossible to manufacture the SOI wafer having the active layer containing no defect since the epitaxial wafer contains other defects inherent to it, such as stacking fault and/or dislocation. Further disadvantageously, from the fact that the epitaxial wafer is rather expensive, using the epitaxial wafer for the active layer side silicon wafer of the SOI wafer could increase the manufacturing cost of the SOI wafer.

Further, properly controlling the V/G allows the silicon single crystal containing a region having no COP to be grown. However, if the V/G exceeds an upper allowable limit, an OSF-ring region (i.e., a region exhibiting a ring shape of Oxidation induced Stacking Fault generated by the heat treatment) or a COP region would appear, and if the V/G falls out of a lower allowable limit, a dislocation cluster region would appear. The allowable range of the V/G is quite narrow, and accordingly it is not easy to produce such crystal containing no COP and OSF-ring regions and no dislocation cluster in a stable manner.

An object of the present invention is to provide a manufacturing method of a silicon wafer, which can vanish the COP within the silicon wafer. Especially, the object of the present invention is to provide a manufacturing method of a silicon wafer, which can vanish the COP existing in a region defined by a depth more than some µm from the surface of the silicon wafer.

Another object of the present invention is to provide a manufacturing method of a SOI wafer for manufacturing a silicon wafer containing no COP existing therein, as well as for manufacturing a SOI wafer by using said silicon wafer as an active layer side silicon wafer.

Yet another object of the present invention is to provide a manufacturing method of a SOI wafer, which can reduce the COP within the active layer side silicon wafer, without using an expensive epitaxial wafer or a no-defect crystal, which cannot be manufactured easily, or without the need for introducing any additional new steps to the existing SOI manufacturing process.

DISCLOSURE OF THE INVENTION

A first invention provides a manufacturing method of a silicon wafer, in which a silicon wafer that has been sliced from a silicon single crystal is heat-treated in an oxidizing atmosphere, wherein assuming that a temperature at which said heat treatment is carried out in said oxidizing atmosphere is denoted as T (° C.) and an interstitial oxygen concentration is denoted as [Oi] (atoms/cm³), said manufacturing method of the silicon wafer characterized in that a relation between said temperature T and said interstitial oxygen concentration [Oi] may satisfy the following formula:

$$[Oi] \leq 2.123 \times 10^{21} \exp(-1.035/k(T+273)),$$

where, said interstitial oxygen concentration is a value measured in accordance with FT-IR method (ASTM F-121, 1979) and the k is the Boltzmann's constant, $8.617 \times 10^{-5}$ (eV/K).

In this first invention, the silicon wafer is heat-treated in the oxidizing atmosphere. During this treatment, the temperature T and the interstitial oxygen concentration [Oi] satisfies the relation defined by the above formula. Resultantly, the COP within the silicon wafer can be vanished.

If the silicon wafer is heat-treated in the argon or hydrogen atmosphere, the COP in the silicon wafer existing in the region close to the surface will vanish. The COP in the deeper region, however, will not vanish. In contrast to this, the heat treatment in the oxidizing atmosphere, as described above, can vanish the COP even in the deeper region within the silicon wafer. The reason for this is that interstitial silicon atoms generated in the surface of the silicon wafer by the oxidizing heat treatment are diffused into the internal of the silicon wafer and that thus diffused atoms fill the COP representing the void.

It is to be noted that the atmosphere used in the above heat treatment should not necessarily be the atmosphere of 100% oxygen, but it may be the atmosphere containing the oxygen partially.

A second invention provides a manufacturing method of a silicon wafer in accordance with the first invention, in which the silicon single crystal has been doped with phosphorus by a neutron irradiation.

In the manufacturing method of the silicon wafer according to the second invention, firstly the silicon single crystal bar is grown without doping with any dopant.

The neutrons are then irradiated to thus grown silicon single crystal bar to thereby dope the silicon single crystal bar with the phosphorus. This can make a specific resistance in the silicon single crystal uniform, especially along its growing axis.

A third invention provides a manufacturing method of a silicon wafer in accordance with the first or the second invention, in which said silicon single crystal has been doped with nitrogen by a concentration of $2 \times 10^{13}$ atoms/cm$^3$ or more.

In the manufacturing method of the silicon wafer according to the third invention, the silicon single crystal has been doped with nitrogen by a concentration of $2 \times 10^{13}$ atoms/cm$^3$ or more. This can help reduce the COP size in the as-grown crystal, and facilitates the vanishment of the COP in the shorter period of heat treatment. The reason why the COP size can be reduced by the doping with nitrogen is that the doping with the nitrogen can suppress the aggregation of vacancies in the course of cooling during the crystal growing.

Further, the pinning effect for the dislocation by the nitrogen can suppress the generation of the slip dislocation possibly caused by the high temperature heat treatment.

Concerning the above, with the doping amount of the nitrogen less than $2 \times 10^{13}$ atoms/cm$^3$, the above pointed effect could not be achieved.

Any doping method of nitrogen may be employed, that has been known in the art. For example, a silicon wafer coated with a nitrogen film may be fused together with a silicon polycrystal material to thereby accomplish the doping.

A fourth invention provides a manufacturing method of a silicon wafer in accordance with any one of the first to third inventions, in which said silicon single crystal has been doped with carbon by a concentration of $5 \times 10^{16}$ atoms/cm$^3$ or higher.

In the manufacturing method of the silicon wafer according to the fourth invention, the silicon single crystal has been doped with the carbon in a density of $5 \times 10^{16}$ atoms/cm$^3$ or more. This can improve the mechanical strength of the silicon wafer and suppress the slip otherwise induced in the heat treatment, as it is the case with the nitrogen doping.

The doping method of the carbon is not specifically limited, and for example, a predetermined amount of carbons may be fused together with a silicon polycrystal material to thereby accomplish the doping.

A fifth invention provides a manufacturing method of a silicon wafer in accordance with any one of the first to the fourth inventions, in which the silicon wafer is mirror-polished after said heat treatment in said oxidizing atmosphere. The surface state of the silicon wafer prior to the heat treatment may be a state with no mirror polishing applied thereto (or etched state).

If the silicon wafer is heat-treated in the oxidizing atmosphere, the COP in the region defined by a depth of about 5 μm or more from the surface of the silicon wafer vanishes. On the other hand, there remains the COP in a shallow region defined by the depth of 5 μm or less from the surface of the silicon wafer, in a concentration level of about 1/10 to 1/100 relative to that prior to the heat treatment in the oxidizing atmosphere. To address this, the surface of the silicon wafer is mirror-polished after the heat treatment in the oxidizing atmosphere. Since the polishing is carried out after the heat treatment, no mirror polishing is necessary to be carried out prior to the heat treatment. That is, the polishing after the heat treatment is performed for the two purposes of: flattening the surface; and removing the remaining COP in the vicinity of the surface. Different from the wafer that has been heat-treated in the non-oxidizing atmosphere by the hydrogen or argon, there is no need to limit the polishing amount to a specific value from the reason that if the wafer having the interstitial oxygen concentration satisfying the condition defined by the present invention is heat-treated in the oxidizing atmosphere, the COP in the deep region can be vanished, and accordingly the polishing after the heat treatment would not expose the COP, which could otherwise form the pit.

A sixth invention provides a manufacturing method of a SOI wafer, in which a SOI wafer is manufactured by using a silicon wafer manufactured by the method as defined by the fifth invention for an active layer side wafer.

A seventh invention provides a manufacturing method of a SOI wafer, in which a buried oxide film is formed by applying a heat treatment to an active layer side silicon wafer in an oxidizing atmosphere, and said active layer side silicon wafer is then bonded with a wafer in a supporting side (hereafter, referred to as a supporting side wafer) with said buried oxide film interposed therebetween thus to manufacture a bonded SOI wafer, wherein assuming that a temperature at which said heat treatment is applied to said active layer side silicon wafer in said oxidizing atmosphere is denoted as T (° C.) and an interstitial oxygen concentration of said active layer side silicon wafer is denoted as [Oi] (atoms/cm$^3$), said manufacturing method of the SOI wafer characterized in that a relation between said heat treatment temperature T and said interstitial oxygen concentration [Oi] of said active layer side silicon wafer may satisfy the following formula:

$$[Oi] \leq 2.123 \times 10^{21} \exp(-1.035/k(T+273)),$$

where, said interstitial oxygen concentration is a value measured in accordance with FT-IR method (ASTM F-121, 1979) and the k is the Boltzmann's constant, $8.617 \times 10^{-5}$ (eV/K).

In the manufacturing method of the SOI wafer according to the seventh invention, the heat treatment to be applied to the active layer side silicon wafer for forming the buried oxide film therein is carried out under the condition where the relation between the temperature of that heat treatment and the interstitial oxygen concentration in the wafer satisfies the above formula. Resultantly, the buried oxide film is formed in the surface of the active layer side silicon wafer, while the COP can be reduced. By bonding thus fabricated active layer side wafer with the supporting side wafer, the bonded SOI wafer with the reduced COP can be fabricated. In this regard, advantageously the present invention is characterized in that the SOI wafer having the SOI layer with reduced COP can be manufactured without introducing any additional steps to the typical manufacturing process of the bonded SOI wafer.

An eighth invention provides a manufacturing method of a SOI wafer in accordance with the seventh invention, in which a wafer fabricated from a silicon single crystal doped with phosphorus by a neutron irradiation is used as said active layer side silicon wafer.

The silicon wafer that has been sliced out of the silicon single crystal doped with the phosphorus by the neutron irradiation is used for the active layer side silicon wafer, to which said oxidizing heat treatment is applied. Further, the active layer side silicon wafer is bonded with the supporting side wafer with the buried oxide film interposed therebetween. Resultantly, the SOI wafer having the SOI layer with reduced COP can be fabricated. In this regard, a variation in the specific resistance of the active layer side silicon wafers, which have been sliced out of the same single crystal, is limited to an extremely small range, and so such SOI wafers can be fabricated that have uniform specific resistance.

A ninth invention provides a manufacturing method of a SOI wafer in accordance with the seventh or the eighth invention, in which said active layer side silicon wafer is fabricated by using a silicon single crystal doped with nitrogen by a concentration of $2 \times 10^{13}$ atoms/cm$^3$ or more.

Advantageously, in said active layer side silicon wafer, a mechanical strength can be improved as compared to that of the silicon wafer with no-nitrogen doped, and also the occurrence of slipping in the heat treatment can be prevented. Furthermore, the COP size can be reduced, so that the COP can be vanished in much shorter time during the oxidizing heat treatment.

A tenth invention provides a manufacturing method of a SOI wafer in accordance with any one of the seventh to the ninth invention, in which said active layer side silicon wafer is fabricated by using a silicon single crystal doped with carbon by a concentration of $5 \times 10^{16}$ atoms/cm$^3$ or more.

The doping with carbon improves the mechanical strength of the wafer as compared with the non-doped products and prevents the occurrence of slipping.

An eleventh invention provides a manufacturing method of a SOI wafer, in which an active layer side silicon wafer is bonded to a supporting side wafer with an insulating film interposed therebetween and then a heat treatment for enhancing a bonding strength is applied to thus bonded wafer in an oxidizing atmosphere to thereby manufacture a bonded SOI wafer, wherein assuming that a temperature at which said heat treatment for enhancing the bonding strength is carried out in said oxidizing atmosphere is denoted as T (° C.) and an interstitial oxygen concentration of said active layer side silicon wafer is denoted as [Oi] (atoms/cm$^3$), said manufacturing method of the SOI wafer characterized in that a relation between said temperature T and said interstitial oxygen concentration [Oi] may satisfy the following formula:

[Oi]$\leq$2.123$\times$10$^{21}$exp(-1.035/k(T+273)), where, said interstitial oxygen concentration is a value measured in accordance with FT-IR method (ASTM F-121, 1979) and the k is the Boltzmann's constant, 8.617$\times$10$^{-5}$ (eV/K).

In the manufacturing method of the SOI wafer according to the eleventh invention, after the active layer side silicon wafer having been bonded to the supporting side wafer, thus bonded wafer is applied with the heat treatment for enhancing the bonding strength in the oxidizing atmosphere which satisfies the above condition for the temperature and the oxygen concentration. This allows for the production of the SOI wafer with the reduced COP in the active layer (SOI layer) without adding any new steps to the typical manufacturing process of the bonded SOI wafer.

A twelfth invention provides a manufacturing method of a SOI wafer in accordance with the eleventh invention, in which the SOI wafer is fabricated by using said active layer side silicon wafer made from the silicon single crystal doped with phosphorus by the neutron irradiation.

Owing to the phosphorus doping by the neutron irradiation, the silicon single crystal bar may have a uniform dopant concentration, or a uniform specific resistance, even in a crystal growing axis direction. Accordingly, the silicon wafers fabricated from the same single crystal bar may exhibit the uniform specific resistance.

A thirteenth invention provides a manufacturing method of a SOI wafer in accordance with the eleventh or the twelfth invention, in which said active layer side silicon wafer is fabricated by using the silicon single crystal doped with nitrogen by a concentration of $2 \times 10^{13}$ atoms/cm$^3$ or more.

The doping with nitrogen improves the mechanical strength of the active layer side silicon wafer, prevents the occurrence of the slipping and allows the COP to vanish in a short time.

A fourteenth invention provides a manufacturing method of a SOI wafer in accordance with any one of the eleventh to the thirteenth invention, in which said active layer side silicon wafer is fabricated by using the silicon single crystal doped with carbon by a concentration of $5 \times 10^{16}$ atoms/cm$^3$ or more.

The doping with carbon to a predetermined concentration improves the mechanical strength of the active layer side silicon wafer and prevents the occurrence of slipping.

A fifteenth invention provides a manufacturing method of a SOI wafer, comprising the steps of:

fabricating an active layer side silicon wafer by firstly applying an oxidizing heat treatment to a silicon wafer, which satisfies the following formula representing a relation between a heat treatment temperature T and an interstitial oxygen concentration [Oi]:

[Oi]$\leq$2.123$\times$10$^{21}$exp(-1.035/k(T+273)), where, T(° C.) is the temperature at which said heat treatment is carried out in an oxidizing atmosphere, and [Oi] (atoms/cm$^3$) is the interstitial oxygen concentration in the silicon wafer, wherein said interstitial oxygen concentration is a value measured in accordance with FT-IR method (ASTM F-121, 1979) and the k is the Boltzmann's constant, 8.617$\times$10$^{-5}$ (eV/K), and by secondly removing an oxide film and applying a mirror-polishing;

forming an ion implanted layer in said active layer side silicon wafer by forming an oxide film on said active layer side silicon wafer, and ion-implanting via said oxide film;

subsequently, forming a bonded wafer by bonding said active layer side silicon wafer to a supporting side wafer with said oxide film interposed therebetween; and then, separating a part of said active layer side silicon wafer from a boundary defined by said ion implanted layer by holding said bonded wafer at a predetermined temperature to thereby apply a heat treatment thereto.

In the manufacturing method of the SOI wafer according to the fifteenth invention, after applying such oxidizing heat treatment to the silicon wafer that satisfies the above condition, the oxide film is removed therefrom and the mirror polishing is applied thereto thus to fabricate the COP-free wafer. In the fabrication of this COP-free wafer, since the polishing is applied after the heat treatment, there is no need for applying the mirror-polishing prior to the heat treatment. That is, the polishing after the heat treatment is carried out for two purposes of: flattening the surface; and removing the COP remaining in the vicinity of the surface. Thus fabricated silicon wafer is employed as the active side silicon wafer to manufacture the SOI wafer by the typical smart-cut process. That is, the oxide film is formed on the active layer side silicon wafer, and the ions are implanted via said oxide film. Further, the active layer side silicon wafer is bonded to the supporting side wafer with the oxide film interposed therebetween, and a part of the active layer side silicon wafer is separated from the boundary defined by the ion-implanted layer through the heat treatment for separation to thereby fabricate the SOI wafer. This allows for the manufacturing of the SOI wafer containing no COP in the SOI layer.

A sixteenth invention provides a manufacturing method of a SOI wafer in accordance with the fifteenth invention, in which a surface of the separated active layer side wafer (donor wafer) is mirror-polished so that it can be used repeatedly as a substrate for forming a new active layer of the SOI wafer.

A seventeenth invention provides a manufacturing method of a SOI wafer in accordance with the fifteenth or the sixteenth invention, in which said active layer side silicon wafer is fabricated by using a silicon single crystal doped with phosphorus by neutron irradiation.

The doping with phosphorus by the neutron irradiation allows a silicon single crystal bar to obtain a uniform specific resistance in the crystal growing axis direction thereof.

An eighteenth invention provides a manufacturing method of a SOI wafer in accordance with any one of the fifteenth to the seventeenth invention, in which said active layer side silicon wafer is fabricated by using a silicon single crystal doped with nitrogen by a concentration of $2 \times 10^{13}$ atoms/cm$^3$ or more.

The doping with nitrogen improves the mechanical strength, prevents the occurrence of slipping and allows the COP to vanish in a short time.

A nineteenth invention provides a manufacturing method of a SOI wafer in accordance with any one of the fifteenth to the eighteenth invention, in which said active layer side silicon wafer is fabricated by using a silicon single crystal doped with carbon by a concentration of $5 \times 10^{16}$ atoms/cm$^3$ or more.

The doping with carbon in a predetermined concentration improves the mechanical strength of the active layer side silicon wafer and reduces the occurrence of the slipping.

As described above, according to the present invention, the COP existing in the deeper region of the silicon wafer can be vanished as compared with the case where the silicon wafer is heat-treated in the argon or the hydrogen atmosphere to vanish the COP therein.

Further, in the present invention, the active layer side silicon wafer can be fabricated without using expensive epitaxial wafer thereby reducing the manufacturing cost of the SOI wafer.

Furthermore, the present invention allows for the manufacturing of the SOI wafer without the need for any special steps for vanishing the COP in the active layer side silicon wafer.

PREFERRED EMBODIMENTS FOR IMPLEMENTING THE PRESENT INVENTION

Figure 1:
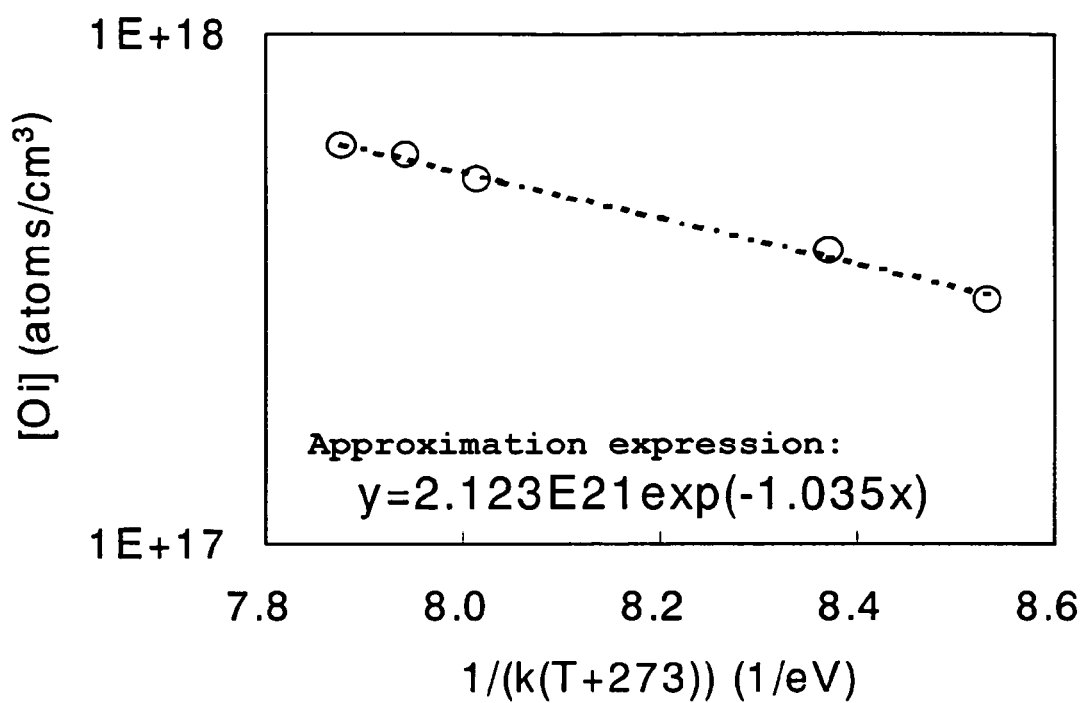
FIG. 1 presents a result from an investigation on a condition for vanishing the COP by an oxidizing heat treatment according to the present invention, indicating that the COP vanishes in a region below the broken line.

First of all, there will be described an experiment that has been conducted in order to find a boundary condition for vanishing the COP in the oxidizing heat treatment according to the present invention.

A plurality of silicon wafers were prepared, which have different interstitial oxygen concentrations from one another. Those silicon wafers were placed in either of an oxygen atmosphere, a nitrogen atmosphere, a hydrogen atmosphere or an argon atmosphere, where the heat treatment was applied thereto at respectively varied temperature. Then, each of the silicon wafers was inspected for the existence of the COP in a region defined by a depth of 300 μm from the surface. The oxygen concentration was measured in accordance with the FT-IR method (the scaling factor: ASTM F-121, 1979). Further, whether or not the COP is existing was determined based on the result of measurements by the infrared bright field interference method. An evaluation of the defect within the silicon wafers by the infrared bright-field interference method was conducted by using the OPP (Optical Precipitate Profiler) available from Accent Optical Technologies. It is to be noted that the evaluation of the defect by the OPP was carried out by using a sample silicon wafer with its both front and back surfaces mirror-polished and the lower limit of detection size of about 30 nm in order to avoid the effect from the uneven front and back surfaces of the silicon wafers. In the inspection, when the defect density had reached the level equal to or less than $1.1 \times 10^4$/cm$^3$, it was determined that the COP had vanished.

The result from the investigation is shown in the below Table 1. It is to be noted that Table 1 indicates a critical temperature (the lowest temperature) at which the COP vanishes in each wafer with different oxygen concentration.

TABLE 1

| [Oi] (atoms/cm$^3$) | Temperature T (° C.) | 1/(k(T + 273)) (1/eV) |
|---|---|---|
| 3.020E+17 | 1087 | 8.533 |
| 3.766E+17 | 1113 | 8.373 |
| 5.191E+17 | 1175 | 8.014 |
| 5.816E+17 | 1188 | 7.943 |
| 6.005E+17 | 1200 | 7.878 |

The values shown in Table 1 represent the result from the heat treatment that was conducted in the oxygen atmosphere. The heat treatments conducted respectively in the nitrogen, the hydrogen and the argon atmosphere could not succeed in vanishing the COP in the depth of 300 μm.

It can be seen from the result of Table 1 that if the oxygen concentration in the silicon wafer is low, then the COP can be vanished at a low temperature. By representing this relation in the Arrhenius plot, as shown in FIG. 1, it is found that the conditions for vanishing the COP in the silicon wafer by the heat treatment in the oxidizing atmosphere may be expressed by the following formula:

$$[Oi] \leq 2.123 \times 10^{21} \exp(-1.035/k(T+273)) \quad (1)$$

where, the interstitial oxygen concentration [Oi] is represented by a value measured in accordance with the FT-IR method (ASTM F-121, 1979) and the k represents the Boltzmann's constant, $8.617 \times 10^{-5}$ (eV/K).

Preferred embodiments of the present invention will now be described, which is made only for the illustration but not intended to limit the scope of the present invention.

For the COP evaluation within the wafer in the illustrated embodiment, the OPP (the detection size of 30 nm) from Accent Optical Technologies was employed similarly to the experiment for finding the COP vanishing condition. The defect evaluation in the wafer surface in the illustrated embodiment was carried out in the light scattering method. In specific, the Surfscan 6220 (the lower limit of detection size of 0.105 μm) or the Surfscan SP1 (the lower limit of detection size of 0.85 μm) manufactured from KLA Tencor were used.

The heat treatment in the oxidizing atmosphere applied to the silicon wafers having different interstitial oxygen concentrations will now be described.

After a 6-inch mirror-polished wafer having an interstitial oxygen concentration of $4.0 \times 10^{17}$ atoms/cm$^3$ had been applied with the heat treatment in the oxygen atmosphere at 1150° C. for two hours, the oxide film was removed therefrom to thus prepare a sample A. It is to be noted that when the temperature of the heat treatment is 1150° C., the interstitial oxygen concentration satisfying the relation defined by the formula (1) is $4.55 \times 10^{17}$ atoms/cm$^3$ or less. Accordingly, the sample A is a wafer that has been applied with the heat treatment that satisfies the formula (1).

On one hand, a wafer having the interstitial oxygen concentration of $5.5 \times 10^{17}$ atoms/cm$^3$ was processed similarly and thus a sample B was fabricated. This sample B has not been applied with the heat treatment satisfying the relation of the formula (1).

Then, the samples A and B were inspected for the defect by using the OPP to measure the defect density at a location defined by the depth of 300 μm, and it was found that no defect was detected in the sample A indicating the defect density not greater than $1.1 \times 10^4$ defects/cm$^3$, while the defects were detected in the sample B with the defect density of about $4.4 \times 10^6$ defects/cm$^3$. By performing the heat treatment satisfying the relation defined by the formula (1), such a silicon wafer can be successfully fabricated that has an extremely low defect density in the deep location, which has not been achieved by the heat treatment in the hydrogen or argon atmosphere according to the prior art.

The case where the silicon single crystal is doped with phosphorus by the neutron irradiation will now be described.

A 400 mm long ingot was sliced out of an 8-inch silicon single crystal, that had grown in the CZ method without being doped with any dopant and had the interstitial oxygen concentration in a range of 4.5 to $6.0 \times 10^{17}$ atmos/cm$^3$, and thus obtained ingot was doped with phosphorus by applying the neutron irradiation thus to fabricate the ingot having a specific resistance of about 50Ω·cm. The specific resistances (by Ω·cm) before and after the neutron irradiation are shown in Table 2. Those alphabets, p and n, placed in front of the numeric values represent p-type and n-type, respectively. It can be seen from the result in Table 2 that if doped with phosphor by the neutron irradiation, the silicon ingot exhibits more uniform specific resistances in respective locations.

TABLE 2

|  | Upper end of ingot | | | Lower end of ingot | | |
| --- | --- | --- | --- | --- | --- | --- |
|  | Center of crystal | 50 mm from center | 90 mm from center | Center of crystal | 50 mm from center | 90 mm from center |
| Before neutron irradiation | p-7869 | p-7791 | p-7771 | p-7347 | p-6840 | p-7423 |
| After neutron irradiation | n-4.73 | n-4.89 | n-4.85 | n-4.94 | n-5.00 | n-4.95 |

Then, a wafer having the oxygen concentration of $5.5 \times 10^{17}$ atoms/cm$^3$ was sliced out of said ingot, and the wafer was mirror-polished and then applied with the heat treatment in the oxygen atmosphere at 1200° C. for 2 hours. At the temperature of 1200° C. in the heat treatment, the interstitial oxygen concentration satisfying the formula (1) is $6.06 \times 10^{17}$ atoms/cm$^3$ or less. Therefore, the above oxygen concentration satisfies the formula (1). Then, the COP density at the location defined by the depth of 300 μm from the surface of the silicon wafer was measured with the OPP. As it is, the COP was not detected, and the COP density at that time was confirmed to be $1.1 \times 10^4$ counts/cm$^3$ or less.

Further, the sample having the same level as that evaluated with the OPP was measured with the SP1, and it was found that the number of defects in the surface was 180 counts. In this concern, from the fact that the number of defects before the heat treatment in the oxygen atmosphere was about 2560, it was found that the number of defects had been reduced down to 1/10 or less. After the wafer surface having been again polished by about 5 μm, the defects in the surface were measured again with the SP1, and no defect was detected. This implies that the defects remain only in the shallow region defined by the depth of 5 μm or less, or in the vicinity of the surface. The reason why the COP in the vicinity of the surface remains unvanished is that the oxygen in the atmosphere is diffused internally in the wafer during the oxidizing heat treatment, and thereby the oxygen concentration in the vicinity of the surface is no more satisfying the relation defined by the formula (1). In this viewpoint, the following experiment was conducted.

A wafer having the oxygen concentration of $5.2 \times 10^{17}$ atoms/cm$^3$ was sliced out of said ingot and applied with the etching in order to remove any strain caused by the processing, and to thus obtained wafer in the state prior to the mirror-polishing, the heat treatment was applied in the oxygen atmosphere at 1200° C. for two hours. After that, the oxide film was removed, and the mirror-polishing was applied to the wafer by about 10 μm thick. The surface of thus fabricated wafer was measured with the SP1, and no defect was detected. This means that in the case where the heat treatment in the oxygen atmosphere is applied first and then the mirror-polishing is carried out, there is no need for performing the mirror-polishing before the heat treatment in the oxygen atmosphere. That is, mirror-polishing process after the heat treatment in the oxygen atmosphere is serving both for removing the layer of remaining defects and for flattening the surface.

Then the case where a silicon single crystal is doped with nitrogen will now be described.

An embodiment of a wafer doped with nitrogen will be described first. A 6-inch wafer having the interstitial oxygen concentration of $5.6 \times 10^{17}$ atoms/cm$^3$ and the nitrogen concentration of $2 \times 10^{13}$ atoms/cm$^3$ was applied with the heat treatment in the oxygen atmosphere at 1200° C. for 0.5 hour thus to prepare a sample C.

Besides, a wafer having the interstitial oxygen concentration of $5.1 \times 10^{17}$ atoms/cm$^3$ and having not doped with nitrogen was processed similarly thus to prepare a sample D.

In addition, a wafer that had been sliced out of the same crystal as the sample D was processed in the same manner as the sample D, except that the heat treatment was carried out at 1200° C. for 1 hour, and thus a sample E was prepared.

The defect density for each of those three samples was evaluated with the OPP. The results indicate that no defect was detected for the samples C and E, with the defect density of $1.1 \times 10^4$ counts/cm$^3$ or less. However, the defect identified by $2.2 \times 10^5$ counts/cm$^3$ was detected in the sample D. Further, in the inspection for the occurrences of the slipping dislocation by the X-ray topography, about 1 cm long slipping dislocation was observed for the samples D and E, while no slipping dislocation was observed in the sample C that had been doped with nitrogen.

It was found that by doping with the nitrogen, advantageously the time required for vanishing the COP was reduced and further the mechanical strength of the wafer was improved and the occurrence of the slipping dislocation was prevented. However, said two effects were not observed in the case of nitrogen concentration lower than $2 \times 10^{13}$ atoms/cm$^3$.

The case where the silicon single crystal is doped with carbon will now be described.

Firstly, a 6-inch wafer having the interstitial oxygen concentration of $4.1\times10^{17}$ atoms/cm$^3$ and the carbon concentration of $5\times10^{16}$ atoms/cm$^3$ was applied with the heat treatment in the oxygen atmosphere at 1150° C. for two hours thus to prepare a sample F. A wafer having the interstitial oxygen concentration of $3.9\times10^{17}$ atoms/cm$^3$ and having not been doped with carbon was similarly processed thus to prepare a sample G.

The result from the evaluation of defect density with the OPP indicates that no defect was detected for the samples F and G, with the defect density of $1.1\times10^4$ counts/cm$^3$ or less. In the inspection for the occurrences of the slipping dislocation by the X-ray topography, about 4 mm long slipping dislocation was observed for the sample G, while no slipping dislocation was observed in the sample F that had been doped with carbon.

It was found that the doping with the nitrogen improved the mechanical strength of the wafer and could prevent the occurrence of the slipping dislocation. However, this effect was not observed in the case of the carbon concentration lower than $5.0\times10^{16}$ atoms/cm$^3$.

The COP vanishment during the formation of the buried oxide film in the SOI wafer will now be described.

First of all, a wafer was sliced out of a 6-inch silicon single crystal having the interstitial oxygen concentration of $4.9\times10^{17}$ atoms/cm$^3$ and the nitrogen concentration of $7\times10^{13}$ atoms/cm$^3$, and mirror-polished, and thus obtained wafer was used as the active layer side wafer and applied with the heat treatment for forming the buried oxide film at 1175° C. for 2 hours. The heat treatment for bonding with the supporting side wafer was performed at 1150° C. for 2 hours, and thus obtained bonded wafer was mirror-polished until the thickness of the active layer reached 10 μm, thus fabricating the SOI wafer.

It is to be noted that the interstitial oxygen concentration satisfying the formula (1) at the temperature of 1175° C. is $5.26\times10^{17}$ atoms/cm$^3$ or less. Therefore, the relation between the temperature during the formation of the buried oxide film and said oxygen concentration satisfies the formula (1).

The surface of the active layer of the bonded SOI wafer that had been fabricated in the above described manufacturing method was evaluated by using the Surfscan 6220, and no defect was detected. This means that by controlling the interstitial oxygen concentration of the active layer side wafer and the temperature of the heat treatment for forming the buried oxide film so as to satisfy the relation defined by the formula (1), the high quality SOI wafer containing no COP could be successfully fabricated without adding any new steps to the existing manufacturing method of the typical bonded SOI wafer.

The COP vanishment in the bonded SOI wafer during the heat treatment for enhancing the bonding strength will now be described.

First of all, the heat treatment (at 1050° C. for 4 hours) for forming the buried oxide film was applied to the supporting side wafer. Secondly, a 6-inch wafer having the interstitial oxygen concentration of $3.7\times10^{17}$ atoms/cm$^3$ and the nitrogen concentration of $8\times10^{13}$ atoms/cm$^3$ and also having been finished with the mirror-polishing was used as the active layer side wafer, and the heat treatment for bonding it with said supporting side wafer containing the oxide film was applied at 1150° C. for 2 hours and then the polishing is applied to thus obtained bonded wafer until the thickness of the active layer reached 10 μm, thus fabricating the SOI wafer. The relation between the temperature 1150° C. of the heat treatment for enhancing the bonding strength and said interstitial oxygen concentration satisfies the formula (1).

The surface of the active layer of the bonded SOI wafer having fabricated according to the above-described method was evaluated with the Surfscan 6220, and no defect was detected. This means that by controlling the interstitial oxygen concentration of the active layer side wafer and the temperature of the bonding heat treatment so as to satisfy the relation defined by the formula (1), the high quality SOI wafer containing no COP could be successfully fabricated without adding any new steps to the existing manufacturing method of the typical bonded SOI wafer.

The SOI wafer having a thinned active layer will now be described.

First of all, a wafer having the interstitial oxygen concentration of $3.8\times10^{17}$ atoms/cm$^3$ and the nitrogen concentration of $9\times10^{13}$ atoms/cm$^3$ was sliced out of a 6-inch silicon single crystal, applied with the etching in order to remove the strain caused by the processing and then, in the state prior to the mirror-polishing, applied with the heat treatment in the oxygen atmosphere at 1150° C. for 2 hours. The relation between the temperature of this heat treatment and said interstitial oxygen concentration satisfies the formula (1). After that, the oxide film was removed, and the mirror-polishing was performed by about 10 μm thick. Thus processed wafer was used as the active layer side wafer, and the heat treatment for bonding it with the supporting side wafer containing the buried oxide film was performed at 1150° C. for 2 hours, and the polishing was applied until the thickness of the active layer reached 1 μm, thus fabricating the SOI wafer.

The active layer of this SOI wafer was inspected to evaluate the defect in its surface, and no defect was detected. This means that by employing as the active layer side wafer the wafer that had been applied with the heat treatment satisfying the condition defined by the formula (1) and then finished by the mirror-polishing, the SOI wafer containing no COP even with the thinned active layer could be successfully fabricated.

Finally, a method for manufacturing the SOI wafer by using the smart cut method will be described.

Firstly, a wafer having the interstitial oxygen concentration of $4.0\times10^{17}$ atoms/cm$^3$ and the nitrogen concentration of $8\times10^{13}$ atoms/cm$^3$ was sliced out of an 8-inch silicon single crystal, applied with the etching in order to remove the strain caused by the processing and then, in the state prior to the mirror-polishing, applied with the heat treatment in the oxygen atmosphere at 1150° C. for 2 hours. After that, the oxide film was removed, and the mirror-polishing was performed by about 10 μm thick. Thus processed wafer was used as the active layer side wafer, and a thin-film SOI wafer was fabricated in the smart cut method. A condition for the fabrication was as described below.

An oxide film of about 120 nm thick was formed on the active layer side wafer, and hydrogen ions were implanted in the surface of said wafer. The ion implantation energy was 25 keV and an implantation dose was $8\times10^{16}$ atoms/cm$^2$. After the active layer side wafer having been bonded with the supporting side wafer, thus obtained bonded wafer was heat-treated at 500° C. for 30 minutes so as to separate a part of the active layer side wafer from the boundary defined by the minute bubble layer. Secondly, the bonding strength between the supporting side wafer and the active layer was enhanced by the heat treatment at 1100° C. for 2 hours. The active layer was thinned ultimately down to 100 nm thick thus to complete the SOI wafer (a sample H). It is to be noted that the separated active layer side wafer (i.e., the donor wafer) was applied with the re-polishing by about 5 μm repeatedly and reused 5 times as the active layer side wafer. The SOI wafer that had been fabricated at the fifth production cycle was taken as a sample I, on which the defect evaluation was performed along with the sample H.

If any COP representing the void region exists in the active layer side wafer, there could exist a through hole in the active layer of the SOI wafer. Such holes can be detected in the following manner. That is, firstly the SOI wafer is dipped in hydrofluoric acid. If there exists a hole penetrating through the active layer, during this process of dipping, the hydrofluoric acid penetrates into that hole, which in turn induces melting of the buried oxide film, and finally it can be detected easily with a laser particle counter. The defect to be detected in this method (i.e., the hole having penetrated through the active layer) is referred to as the hydrofluoric acid defect. In the present embodiment, the SOI wafer was dipped in the hydrofluoric acid for 15 minutes, and the Surfscan 6220 was used to count LPD (Light Point Defect) not smaller than 5 µm.

The samples H and I were inspected to evaluate the hydrofluoric acid defect in accordance with the above method, and no defect was detected for either of them.

Therefore, it has been found that if the wafer that has been fabricated in the above-described manner is used as the active layer side wafer, it is possible to fabricate the thin film SOI wafer containing extremely small number of hydrofluoric acid defects, and more advantageously it has been confirmed that the wafer that has been fabricated in the method of the present invention can be used repeatedly as the active layer side wafer by performing the polishing in the repeated manner.

Lastly, a wafer to be effectively subject to the heat treatment of the present invention will be described. The wafer to be subject thereto is a wafer containing the COP. Whether or not the COP would vanish through the oxidizing heat treatment depends on the temperature of the heat treatment and the interstitial oxygen concentration in the wafer but not on the size of the COP.

Accordingly, there is no need to specifically limit the size of the COP. However, since the time required for the heat treatment must be longer for the larger size of the COP, therefore the smaller size of the COP should be favorable.

Specifically, the size not greater than 0.2 µm should be substantially practical.

The silicon wafer fabricated according to the present invention has extremely advantageous features that could not be obtained in the method according to the prior art.

(1) The COP has successfully been vanished across a broad range from the surface to the deep inside of the silicon wafer (e.g., down to the depth of 300 µm).

(2) The specific resistance is highly uniform.

(3) The wafer contains no stacking fault and/or dislocation, which are inherent to the epitaxial wafer.

(4) Since the oxygen concentration is low, there would be an extremely low possibility in the heat treatment in the device manufacturing process that any oxygen composites, such as oxygen precipitates or thermal donor, would be generated, which could vary the specific resistance.

What is claimed is:

1. A manufacturing method of a silicon wafer not including COP comprising:
   preparing a silicon single crystal by the Czochralski method,
   slicing a first silicon wafer from said silicon single crystal to obtain a silicon wafer including COP,
   heat-treating said silicon wafer including COP in an oxidizing atmosphere to obtain the silicon wafer not including COP, wherein
   assuming that a temperature at which said heat treatment is carried out in said oxidizing atmosphere is denoted as T (° C.) and an interstitial oxygen concentration in said silicon water including COP is denoted as [Oi](atoms/cm$^3$), said manufacturing method of the silicon wafer characterized in that a relation between said temperature T and said interstitial oxygen concentration [Oi] satisfies the following formula:

$$[Oi] \leq 2.123 \times 10^{21} \exp(-1.035/k(T+273)),$$

where, said interstitial oxygen concentration in said silicon wafer including COP is a value measured in accordance with FT-IR method (ASTM F-121, 1979) and the k is the Boltzmann's constant, $8.617 \times 10^{-5}$ (eV/K).

2. A manufacturing method of a silicon wafer in accordance with claim 1, in which said silicon single crystal is a silicon single crystal doped with nitrogen by a concentration of $2 \times 10^{13}$ atoms/cm$^3$ or more and/or a single crystal doped with carbon by a concentration of $5 \times 10^{16}$ atoms/cm$^3$ or more is.

3. A manufacturing method of a silicon wafer in accordance with claim 1, in which the silicon wafer is mirror-polished after said heat treatment in said oxidizing atmosphere.

4. A manufacturing method of a silicon wafer in accordance with claim 2, in which the silicon wafer not including COP is mirror-polished after said heat treatment in said oxidizing atmosphere.

5. A manufacturing method of a SOI wafer, in which a buried oxide film is formed by applying a heat treatment to an active layer side silicon wafer including COP in an oxidizing atmosphere, to obtain an active layer side silicon wafer not including COP, and said active layer side silicon wafer not including COP is then bonded to a supporting side wafer with said buried oxide layer interposed therebetween thus to manufacture a bonded SOI wafer, wherein
   assuming that a temperature at which said heat treatment is applied to said active layer side silicon wafer including COP in said oxidizing atmosphere is denoted as T(° C.) and an interstitial oxygen concentration of said active layer side silicon wafer including COP is denoted as [Oi] (atoms/cm$^3$), said manufacturing method of the SOI wafer characterized in that a relation between said heat treatment temerature T and said interstitial oxygen concentration [Oi] of said active layer side silicon wafer satisfies the following formula:

$$[Oi] \leq 2.123 \times 10^{21} \exp(-1.035/k(T+273)),$$

where, said interstitial oxygen concentration is a value measured in accordance with FT-IR method (ASTM F-121, 1979) and the k is the Boltzmann's constant, $8.617 \times 10^{-5}$ (eV/K).

6. A manufacturing method of a SOI wafer in accordance with claim 5, in which said active layer side silicon wafer including COP is fabricated by using a silicon single crystal doped with nitrogen by a concentration of $2 \times 10^{13}$ atoms/cm$^3$ or more and/or by using a silicon single crystal doped with carbon by a concentration of $5 \times 10^{16}$ atoms/cm$^3$ or more.

7. A manufacturing method of a SOI wafer, in which an active layer side silicon wafer including COP is bonded to a supporting side wafer with an insulating film interposed therebetween and then a heat treatment for enhancing a bonding strength is applied to thus bonded wafer in an oxidizing atmosphere to thereby manufacture a bonded SOI wafer, wherein
   assuming that a temperature at which said heat treatment for enhancing the bonding strength is carried out in said oxidizing atmosphere is denoted as T(° C.) and an interstitial oxygen concentration of said active layer side silicon wafer including COP is denoted as [Oi] (atoms/cm³), said manufacturing method of the SOI wafer characterized in that a relation between said temperature T and said interstitial oxygen concentration [Oi] satisfies the following formula:

$$[Oi] \leq 2.123 \times 10^{21} \exp(-1.035/k(T+273)),$$

where, said interstitial oxygen concentration of said active layer side silicon wafer including COP is a value measured in accordance with FT-IR method (ASTM F-121, 1979) and the k is the Boltzmann's constant, $8.617 \times 10^{-5}$ (eV/K).

8. A manufacturing method of a SOI wafer in accordance with claim 7, in which said active layer side silicon wafer including COP is fabricated by using a silicon single crystal doped with nitrogen by a concentration of $2 \times 10^{13}$ atoms/cm³ or more and/or by using a silicon single crystal doped with carbon by a concentration of $5 \times 10^{16}$ atoms/cm³ or more.

9. A manufacturing method of a SOI wafer, comprising the steps of:
   fabricating an active layer side silicon wafer not including COP by firstly applying an oxidizing heat treatment to a silicon wafer, including COP, which satisfies the following formula representing a relation between a heat treatment temperature T and an interstitial oxygen concentration [Oi] of the silicon wafer including COP:

$$[Oi] \leq 2.123 \times 10^{21} \exp(-1.035/k(T+273)),$$

where, T(° C.) is the temperature at which said heat treatment is carried out in an oxidizing atmosphere, and [Oi] (atoms/cm³) is the interstitial oxygen concentration in the silicon wafer, including COP, wherein said interstitial oxygen concentration of the silicon wafer including COP is a value measured in accordance with FT-IR method (ASTM F-121, 1979) and the k is the Boltzmann's constant, $8.617 \times 10^{-5}$ (eV/K), and by secondly removing an oxide film and applying a mirror-polishing;
   forming an ion implanted layer in said active layer side silicon wafer not including COP by forming an oxide film on said active layer side silicon wafer, and ion-implanting via said oxide film;
   subsequently, forming a bonded wafer by bonding the active layer side silicon wafer having the ion implanted layer to a supporting side wafer with said oxide film interposed therebetween; and
   then, separating a part of said active layer side silicon wafer from a boundary defined by said ion implanted layer by holding said bonded wafer at a predetermined temperature to thereby apply a heat treatment thereto.

10. A manufacturing method of a SOI wafer in accordance with claim 9, in which a surface of the separated part of said active layer side silicon wafer is mirror-polished so that said separated part of said active layer side silicon wafer can be used repeatedly as a substrate for forming a new active layer of the SOI wafer.

11. A manufacturing method of a SOI wafer in accordance with claim 9, in which said active layer side silicon wafer including COP is fabricated by using a silicon single crystal doped with nitrogen by a concentration of $2 \times 10^{13}$ atoms/cm³ or more and/or by using a silicon single crystal doped with carbon by a concentration of $5 \times 10^{16}$ atoms/cm³ or more.

12. A manufacturing method of a SOI wafer in accordance with claim 10, in which said active layer side silicon wafer including COP is fabricated by using a silicon single crystal doped with nitrogen by a concentration of $2 \times 10^{13}$ atoms/cm³ or more and/or by using a silicon single crystal doped with carbon by a concentration of $5 \times 10^{16}$ atoms/cm³ or more.

* * * * *